(12) United States Patent
Yu

(10) Patent No.: US 6,867,101 B1
(45) Date of Patent: Mar. 15, 2005

(54) METHOD OF FABRICATING A SEMICONDUCTOR DEVICE HAVING A NITRIDE/HIGH-K/NITRIDE GATE DIELECTRIC STACK BY ATOMIC LAYER DEPOSITION (ALD) AND A DEVICE THEREBY FORMED

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/826,472

(22) Filed: Apr. 4, 2001

(51) Int. Cl.[7] ............... H01L 21/336; H01L 21/3205; H01L 21/31

(52) U.S. Cl. ............... 438/287; 438/591; 438/592; 438/769; 438/785; 438/791

(58) Field of Search ............... 438/287, 585, 438/301, 591, 592, 769, 775, 785, 791, 216, 238, 541, 770, 305, 366, 513, 636

(56) References Cited

U.S. PATENT DOCUMENTS

| | | | | |
|---|---|---|---|---|
| 5,834,353 A | * | 11/1998 | Wu | 438/287 |
| 5,963,810 A | * | 10/1999 | Gardner et al. | 438/287 |
| 5,994,192 A | * | 11/1999 | Chen | 438/303 |
| 6,114,228 A | * | 9/2000 | Gardner et al. | 438/585 |
| 6,124,158 A | * | 9/2000 | Dautartas et al. | 438/216 |
| 6,251,761 B1 | * | 6/2001 | Rodder et al. | 438/591 |
| 6,369,430 B1 | * | 4/2002 | Adetutu et al. | 257/382 |
| 6,451,676 B2 | * | 9/2002 | Wurzer et al. | 438/528 |
| 6,531,368 B1 | * | 3/2003 | Yu | 438/306 |

\* cited by examiner

*Primary Examiner*—John F. Niebling
*Assistant Examiner*—Ron Pompey
(74) *Attorney, Agent, or Firm*—Farjami & Farjami LLP

(57) ABSTRACT

A method of fabricating a semiconductor device, having a nitride/high-k material/nitride gate dielectric stack with good thermal stability which does not diffuse into a silicon substrate, a polysilicon gate, or a polysilicon-germanium gate when experiencing subsequent high temperature processes, involving: (a) providing a substrate; (b) initiating formation of the nitride/high-k material/nitride gate dielectric stack by depositing a first ultra-thin nitride film on the substrate; (c) depositing a high-k material, such as a thin metal film, on the first ultra-thin nitride film; (d) depositing a second ultra-thin nitride film on the high-k material, thereby forming a sandwich structure; (e) completing formation of the nitride/high-k material/nitride gate dielectric stack from the sandwich structure; and (f) completing fabrication of the semiconductor device.

18 Claims, 2 Drawing Sheets

METHOD OF FABRICATING A SEMICONDUCTOR DEVICE HAVING A NITRIDE/HIGH-K/NITRIDE GATE DIELECTRIC STACK BY ATOMIC LAYER DEPOSITION (ALD) AND A DEVICE THEREBY FORMED

CROSS-REFERENCE TO RELATED APPLICATION(S)

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

The present invention relates to semiconductor devices and their methods of fabrication. More particularly, the present invention relates to the formation of gate stacks. Even more particularly, the present invention relates to forming a gate stack having superior thermal stability and reduced diffusion into silicon-bearing semiconductor structures.

2. Description of the Background Art

Currently, the semiconductor industry has an interest in reducing the critical dimensions of transistors. As such, the thickness of the gate oxide must also be reduced. In so doing, the related art has faced problems associated with a significant increase in direct tunneling leakage current through a very thin gate oxide (i.e., <25 Angstroms). In an effort to suppress the severe gate leakage current, a high dielectric constant (high-k) material may be used as a gate dielectric, replacing a conventional thermal oxide. Several high dielectric constant (high-k) materials (metal oxides) are good candidates for gate dielectric insulators: zirconia or zirconium dioxide ($ZrO_2$), hafnia or hafnium dioxide ($HfO_2$), titania or titanium dioxide ($TiO_2$), tantala or tantalum pentoxide ($Ta_2O_5$), and the like.

However, a high-k gate dielectric insulator, such as the foregoing metal oxides, must have a thickness which is much greater than that of a conventional thermal oxide to be similarly effective, because the direct current density is exponentially proportional to a dielectric layer's thickness. Thus, the direct tunneling current flow through a gate dielectric insulator may be significantly reduced, motivating its use in very small transistors. Another major problem with using a high-k material is thermal instability. High-k materials tend to diffuse into the silicon (Si) substrate, a polysilicon (poly-Si) gate, or a polysilicon-germanium (poly-SiGe) gate during subsequent high temperature processing steps. Therefore, a need exists for a method of fabricating a semiconductor device having a high-k dielectric gate insulator with good th mal stability which does not diffuse into the Si substrate, the poly-Si gate, or the poly-SiGe gate when experiencing subsequent high temperature processes.

BRIEF SUMMARY OF THE INVENTION

Accordingly, the present invention provides a method of fabricating a semiconductor device comprising a high-k dielectric gate insulator having good thermal stability which does not diffuse into a Si substrate, a poly-Si gate, or a poly-SiGe gate when experiencing subsequent high temperature processes, and a device thereby formed. Generally, the present invention device has a high-k gate dielectric insulator (i.e., a nitride/high-k material/nitride gate dielectric stack) formed by atomic layer deposition (ALD). The present invention method for fabricating the present device, generally comprises: depositing a first ultra-thin nitride film; depositing a high-k material film; and depositing a second ultra-thin nitride film. The unique features of the present method basically involve a sandwich structure formed by depositing an ultra-thin nitride film, which may comprise silicon nitride ($Si_3N_4$), before and after depositing the high-k material film, which may comprise a thin metal film, whereby the first ultra-thin nitride film provides resistance to metal diffusion into the Si substrate, the poly-Si gate electrode, or the poly-SiGe gate electrode. This present invention device, so formed, has the advantages of providing sufficient diffusion resistance as well as thermal stability in a thin (i.e., small) feature size.

By way of example, and not of limitation, a semiconductor device having a high-k dielectric gate insulator with good thermal stability which does not diffuse into a Si substrate, a poly-Si gate, or a poly-SiGe gate when experiencing subsequent high temperature processes, may be fabricated according to the present invention by: (a) providing a substrate, wherein the substrate may comprise a silicon wafer or a silicon-on-insulator (SOI) wafer; (b) initiating formation of a nitride/high-k material/nitride gate dielectric stack by depositing a first ultra-thin nitride film on the substrate, wherein the first ultra-thin nitride film may be deposited atomic layer deposition (ALD), and wherein the first ultra-thin nitride film may comprise 1–2 atomic layer(s) of silicon nitride ($Si_3N_4$); (c) depositing a high-k material, which may comprise a thin metal film, on the first ultra-thin nitride film, wherein the thin metal film may comprise at least one metal selected from a group consisting essentially of zirconium (Zr), hafnium (Hf), titanium (Ti), and tantalum (Ta), wherein the thin metal film may also comprise a metal oxide; (d) depositing a second ultra-thin nitride film on the high-k material, thereby forming a sandwich structure, wherein the second ultra-thin nitride film may be deposited atomic layer deposition (ALD), and wherein the second ultra-thin nitride film may comprise 1–2 atomic layer(s) of silicon nitride ($Si_3N_4$); (e) completing formation of the nitride/high-k material/nitride gate dielectric stack, wherein the step (e) comprises (e)(1) depositing a thick gate material on the second ultra-thin nitride film, wherein the thick gate material may comprise a material selected from a group consisting essentially of polysilicon (poly-Si) and polysilicon-germanium (poly-SiGe); (e)(2) patterning the thick gate material, thereby forming a gate electrode; and (e)(3) etching portions of the sandwich structure uncovered by the gate electrode, thereby completing formation of the stack; and (f) completing fabrication of the semiconductor device, wherein step (f) may comprise the forming of a MOSFET structure comprising the stack, wherein the step (f) may further comprise (f)(1) forming a source/drain structure in the substrate and flanking the stack, (f)(2) forming at least one spacer on at least one sidewall of the stack, and (f)(3) silicidizing a shallow source/drain region of the substrate as well as the stack, thereby respectively forming a source/drain silicide in the shallow region and a gate silicide on the stack.

Advantages of the present invention include the reduction of direct tunneling current flow through a gate dielectric insulator of a semiconductor device, and the fabrication of a semiconductor device comprising a high-k dielectric gate insulator having good thermal stability which does not diffuse into a Si substrate, a poly-Si gate, or a poly-SiGe gate when experiencing subsequent high temperature processes. Further advantages of the invention will be demonstrated in the following portions of the specification, wherein the detailed description is for the purpose of fully disclosing preferred embodiments of the invention without thereon placing limitations.

BRIEF DESCRIPTION OF THE DRAWING

For a better understanding of the present invention, reference is made to the several figures of the below-referenced accompanying Drawing which is illustrative in purpose and where like reference numbers denote like elements.

DETAILED DESCRIPTION OF THE INVENTION

Referring more specifically to the drawings for illustrative purposes, the present invention is embodied in the apparatus and method generally shown in FIG. 1 through FIG. 6. These figures depict an embodiment of a process for fabricating a semiconductor device comprising a high-k dielectric gate insulator having good thermal stability which does not diffuse into a Si substrate, a poly-Si gate, or a poly-SiGe gate when experiencing subsequent high temperature processes. Each figure illustrates a particular processing stage, and presents a side view in cross-section of the device at that stage of processing. However, that the apparatus may vary as to configuration and as to details of the parts, and that the method may vary as to the specific steps and sequence, without departing from the basic concepts as disclosed herein, will be appreciated.

Figure 1:
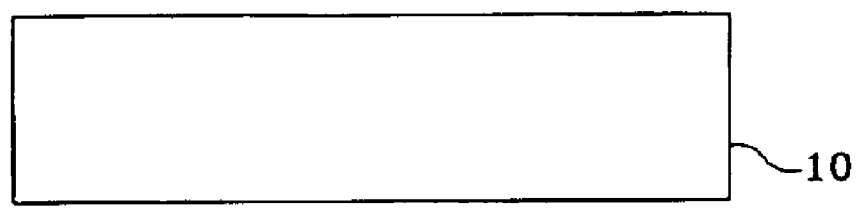
FIG. 1 through FIG. 6, together, constitute a process flow diagram of the fabrication of a semiconductor device, in accordance with the present invention, wherein the semiconductor device is shown in cross-section at various stages of the process.

Referring first to FIG. 1, in the first stage of processing, a substrate 10 is provided, wherein the substrate 10 may comprise a silicon wafer or a silicon-on-insulator (SOI) wafer.

Figure 2:
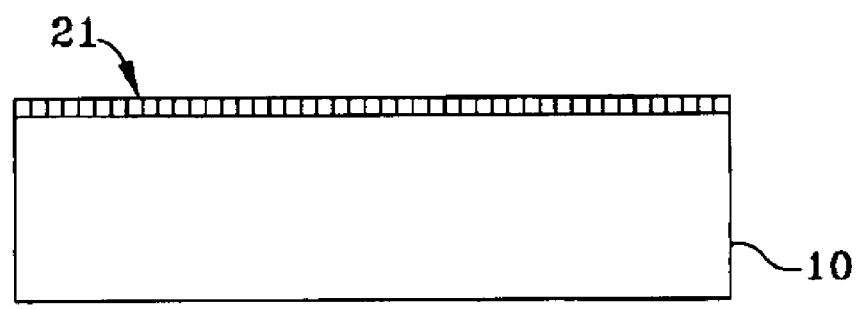

Next, as shown in FIG. 2, a first ultra-thin nitride film 21 is deposited on the substrate 10, thereby initiating formation of a nitride/high-k material/nitride gate dielectric stack, wherein the first ultra-thin nitride film 21 may be deposited using an atomic layer deposition (ALD) technique, wherein the first ultra-thin nitride film 21 may comprise silicon nitride ($Si_3N_4$), and wherein the first ultra-thin nitride film 21 may be a thickness in a range of 1–2 atomic layer(s).

Figure 3:
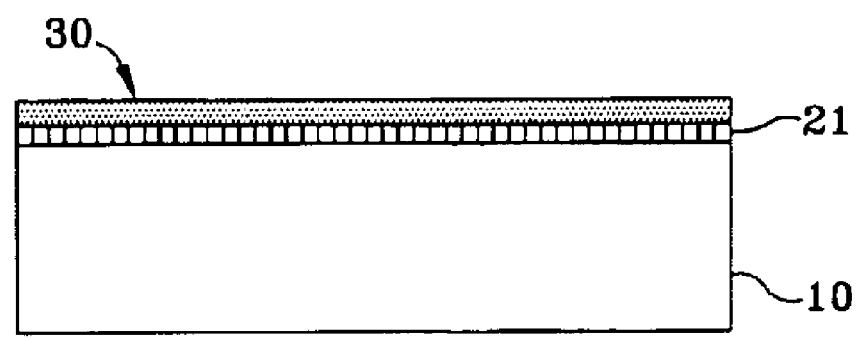

Next, as shown in FIG. 3, a high-k material, such as a thin metal film 30, is deposited on the first ultra-thin nitride film 21, wherein the thin metal film 30 may comprise at least one metal selected from a group consisting essentially of zirconium (Zr), hafnium (Hf), titanium (Ti), and tantalum (Ta), wherein the thin metal film 30 also comprises a metal oxide.

Figure 4:
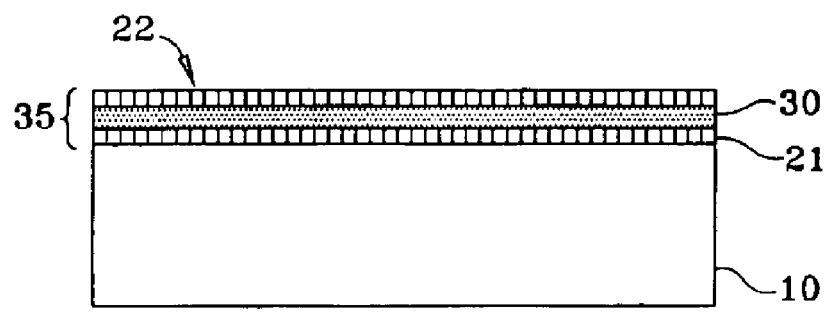

Next, as shown in FIG. 4, a second ultra-thin nitride film 22 is deposited on the high-k material (e.g., the thin metal film 30), thereby forming a sandwich structure 35, wherein the second ultra-thin nitride film 22 may be deposited using an atomic layer deposition (ALD) technique, and wherein the second ultra-thin nitride film 22 may comprise silicon nitride ($Si_3N_4$), and wherein the second ultra-thin nitride film 22 may have a thickness in a range of 1–2 atomic layer(s).

Figure 5:
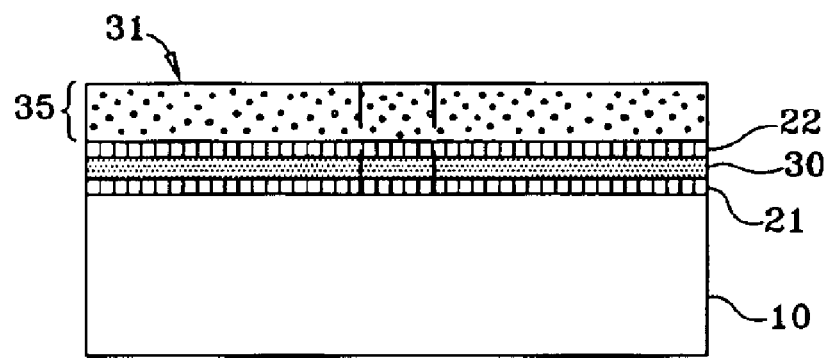

Next, as shown in FIG. 5, a completed nitride/high-k material/nitride gate dielectric stack 40 is formed on the substrate 10, wherein the stack 40 is completed by depositing a thick gate material 31 on the second ultra-thin nitride film 22, wherein the thick gate material 31 may comprise a material selected from a group consisting essentially of polysilicon (poly-Si) and polysilicon-germanium (poly-SiGe); patterning the thick gate material 31 with a material such as a photoresist (not shown), thereby forming a gate electrode 32; and etching portions of the sandwich structure 35 uncovered by the gate electrode 32, thereby forming the nitride/high-k material/nitride gate dielectric stack 40.

Figure 6:
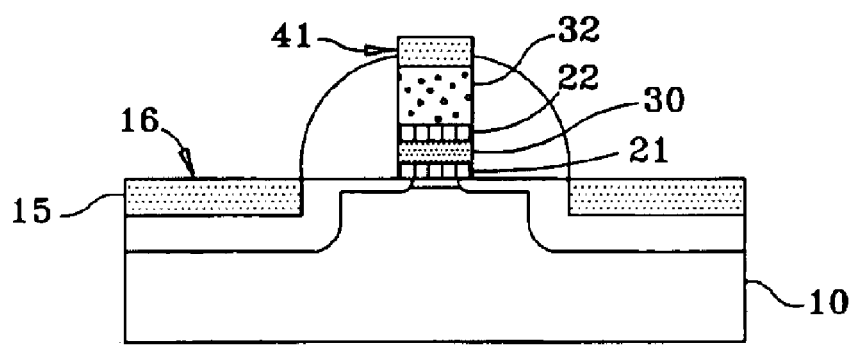

As depicted in FIG. 6, a MOSFET structure 50 comprises the stack 40, wherein the MOSFET structure 50 further comprises a source/drain structure 51 formed in the substrate 10 and flanking the stack 40, at least one spacer 52 formed on at least one sidewall of the stack 40, and a shallow source/drain region 15 as well as the nitride/high-k/nitride gate dielectric stack 40 being silicidized to respectively form a source/drain silicide 16 in the shallow region 15 of the substrate 10 and a gate silicide 41 on the stack 40.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. § 112, sixth paragraph, unless the element is expressly recited using the phrase "means for."

What is claimed:

1. A method of fabricating a semiconductor device, having a nitride/high-k material/nitride gate dielectric stack, comprising:

initiating formation of the nitride/high-k material/nitride gate dielectric stack by:

depositing a first ultra-thin nitride film on a semiconductor substrate, wherein the first ultra-thin nitride film is deposited by using an atomic layer deposition (ALD) technique;

depositing a high-k material on the first ultra-thin nitride film, wherein the high-k material comprises a thin metal film, and wherein the thin metal film comprises at least one material selected from a group consisting essentially of zirconium (Zr), hafnium (Hf), and titanium (Ti); and depositing a second ultra-thin nitride film on the high-k material, thereby forming a sandwich structure, wherein the second ultra-thin nitride film is deposited using an atomic layer deposition (ALD) technique;

depositing a gate material on the second ultra-thin nitride film, wherein said gate material comprises polysilicon-germanium (poly-SiGe);

completing formation of the nitride/high-k material/nitride gate dielectric stack from the sandwich structure; and completing fabrication of the device;

wherein the first and second ultra-thin nitride films prevent the at least one material selected from the group consisting essentially of zirconium (Zr), hafnium (Hf), and titanium (Ti) from diffusing into the semiconductor substrate and the gate material, respectively.

2. A method as recited in claim 1, wherein the substrate comprises a silicon-on-insulator (SOI) wafer.

3. A method as recited in claim 1, wherein the first ultra-thin nitride film comprises silicon nitride ($Si_3N_4$), and wherein the first ultra-thin nitride film has a thickness in a range of 1 to 2 atomic layer(s).

4. A method as recited in claim 1, wherein the thin metal film further comprises tantalum (Ta).

5. A method as recited in claim 1, wherein the thin metal film comprises a metal oxide.

6. A method as recited in claim 1, wherein the second ultra-thin nitride film comprises silicon nitride ($Si_3N_4$), and wherein the second ultra-thin nitride film has a thickness in a range of 1 to 2 atomic layer(s).

7. A method as recited in claim 1, wherein completing formation of the nitride/high-k material/nitride gate dielectric stack from the sandwich structure comprises:

patterning the gate material, thereby forming a gate electrode; and etching portions of the sandwich structure uncovered by the gate electrode, thereby completing formation of the nitride/high-k material/nitride gate dielectric stack.

8. A method as recited in claim 1, wherein completing fabrication of the device comprises forming of a MOSFET structure comprising the gate dielectric stack.

9. A method as recited in claim 7, wherein the gate material is patterned using a material such as photoresist.

10. A method as recited in claim 1, wherein completing fabrication of the device comprises:

forming a source/drain structure in the substrate and flanking the gate dielectric stack;

forming at least one spacer on at least one sidewall of the gate dielectric stack; and silicidizing a shallow source/drain region as well as the high-k gate stack, thereby forming a source/drain silicide in a shallow source/drain region of the substrate and a gate silicide on the gate dielectric stack.

11. A method of fabricating a semiconductor device, having a nitride/high-k material/nitride gate dielectric stack, comprising:

initiating formation of the nitride/high-k material/nitride gate dielectric stack by:

depositing a first ultra-thin nitride film on a semiconductor substrate, wherein the first ultra-thin nitride film is deposited by using an atomic layer deposition (ALD) technique, and wherein the substrate comprises a silicon-on-insulator (SOI) wafer;

depositing a high-k material on the first ultra-thin nitride film, wherein the high-k material comprises a thin metal film, and wherein the thin metal film comprises at least one material selected from a group consisting essentially of zirconium (Zr), hafnium (Hf), and titanium (Ti); and depositing a second ultra-thin nitride film on the high-k material, thereby forming a sandwich structure, wherein the second ultra-thin nitride film is deposited by using an atomic layer deposition (ALD) technique;

depositing a gate material on the second ultra-thin nitride film, wherein said gate material comprises polysilicon-germanium (poly-SiGe);

completing formation of the nitride/high-k material/nitride gate dielectric stack from the sandwich structure; and completing fabrication of the device;

wherein the first and second ultra-thin nitride films prevent the at least one material selected from the group consisting essentially of zirconium (Zr), hafnium (Hf), and titanium (Ti) from diffusing into the semiconductor substrate and the gate material, respectively.

12. A method as recited in claim 11, wherein the first ultra-thin nitride film comprises silicon nitride ($Si_3N_4$), and wherein the first ultra-thin nitride film has a thickness in a range of 1 to 2 atomic layer(s).

13. A method as recited in claim 12, wherein the thin metal film further comprises tantalum (Ta), and wherein the thin metal film further comprises a metal oxide.

14. A method as recited in claim 13, wherein the second ultra-thin nitride film comprises silicon nitride ($Si_3N_4$), and wherein the second ultra-thin nitride film has a thickness in a range of 1 to 2 atomic layer(s).

15. A method as recited in claim 14, wherein completing formation of the nitride/high-k material/nitride gate dielectric stack from the sandwich structure comprises:

patterning the gate material, thereby forming a gate electrode; and etching portions of the sandwich structure uncovered by the gate electrode, thereby completing formation of the nitride/high-k material/nitride gate dielectric stack.

16. A method as recited in claim 15, wherein completing fabrication of the device comprises forming of a MOSFET structure comprising the gate dielectric stack.

17. A method as recited in claim 16, wherein the gate material is patterned using a material such as photoresist.

18. A method as recited in claim 17, wherein completing fabrication of the device comprises:

forming a source/drain structure in the substrate and flanking the gate dielectric stack;

forming at least one spacer on at least one sidewall of the gate dielectric stack; and silicidizing a shallow source/drain region as well as the high-k gate stack, thereby forming a source/drain silicide in a shallow source/drain region of the substrate and a gate silicide on the gate dielectric stack.

* * * * *